US007254793B2

(12) United States Patent
Chen et al.

(10) Patent No.: US 7,254,793 B2
(45) Date of Patent: Aug. 7, 2007

(54) LATCH MODELING TECHNIQUE FOR FORMAL VERIFICATION

(75) Inventors: Yirng-An Chen, San Jose, CA (US); Robert F. Damiano, Lake Oswego, OR (US); Bharat Kalyanpur, Fremont, CA (US); James H. Kukula, Hillsboro, OR (US)

(73) Assignee: Synopsys, Inc., Mountain View, CA (US)

( * ) Notice: Subject to any disclaimer, the term of this patent is extended or adjusted under 35 U.S.C. 154(b) by 197 days.

(21) Appl. No.: 11/051,109

(22) Filed: Feb. 4, 2005

(65) Prior Publication Data

US 2006/0190870 A1 Aug. 24, 2006

(51) Int. Cl.
*G06F 17/50* (2006.01)
*G06F 9/45* (2006.01)
*G06F 9/455* (2006.01)
(52) U.S. Cl. .................................. 716/5; 716/4; 716/11
(58) Field of Classification Search .................... 716/2, 716/4–6, 11
See application file for complete search history.

(56) References Cited

U.S. PATENT DOCUMENTS

| 5,539,330 | A | * | 7/1996 | McDermid ................... 326/39 |
| 5,886,904 | A | * | 3/1999 | Dai et al. .................... 703/14 |
| 6,587,997 | B1 | * | 7/2003 | Chen et al. .................... 716/4 |
| 2003/0120985 | A1 | * | 6/2003 | Slobodnik et al. .......... 714/718 |

\* cited by examiner

*Primary Examiner*—Paul Dinh
*Assistant Examiner*—Suresh Memula
(74) *Attorney, Agent, or Firm*—Bever, Hoffman & Harms, LLP; Jeanette S. Harms (57) ABSTRACT

A method for formal verification includes a latch remodeling process to reduce computational requirements for clock modeling. Latches that exhibit flip flop-like output behavior in a synthesized layout of sequential logic are identified and replaced with flip flops to generate a remodeled layout. This latch replacement can be performed using rules that filter out latches that do not exhibit flip flop-like output behavior. Clock modeling is then performed on the remodeled layout. Because the remodeled layout contains fewer latches than the original synthesized layout, the computational expense and time required for clock modeling (and hence, formal verification) on the remodeled layout can be significantly reduced over the requirements for clock modeling (and formal verification) on the original synthesized layout.

14 Claims, 6 Drawing Sheets

LATCH MODELING TECHNIQUE FOR FORMAL VERIFICATION

BACKGROUND OF THE INVENTION

1. Field of the Invention

The invention relates to the field of electronic design automation, and in particular to a system and method for accurately and efficiently performing clock modeling in design formal verification.

2. Related Art

An electronic design automation (EDA) system is a computer software system used for designing integrated circuit (IC) devices. The EDA system typically receives one or more high level behavioral descriptions of an IC device (e.g., in HDL languages like VHDL, Verilog, etc.) and translates ("synthesizes") this high-level design language description into netlists of various levels of abstraction. A netlist describes the IC design and is composed of nodes (functional elements) and edges, e.g., connections between nodes. At a higher level of abstraction, a generic netlist is typically produced based on technology independent primitives.

The generic netlist can be translated into a lower level technology-specific netlist based on a technology-specific (characterized) cell library that has gate-specific models for each cell (i.e., a functional element, such as an AND gate, an inverter, or a multiplexer). The models define performance parameters for the cells; e.g., parameters related to the operational behavior of the cells, such as power consumption, delay, and noise. The netlist and cell library are typically stored in computer readable media within the EDA system and are processed and verified using many well-known techniques.

Figure 1:
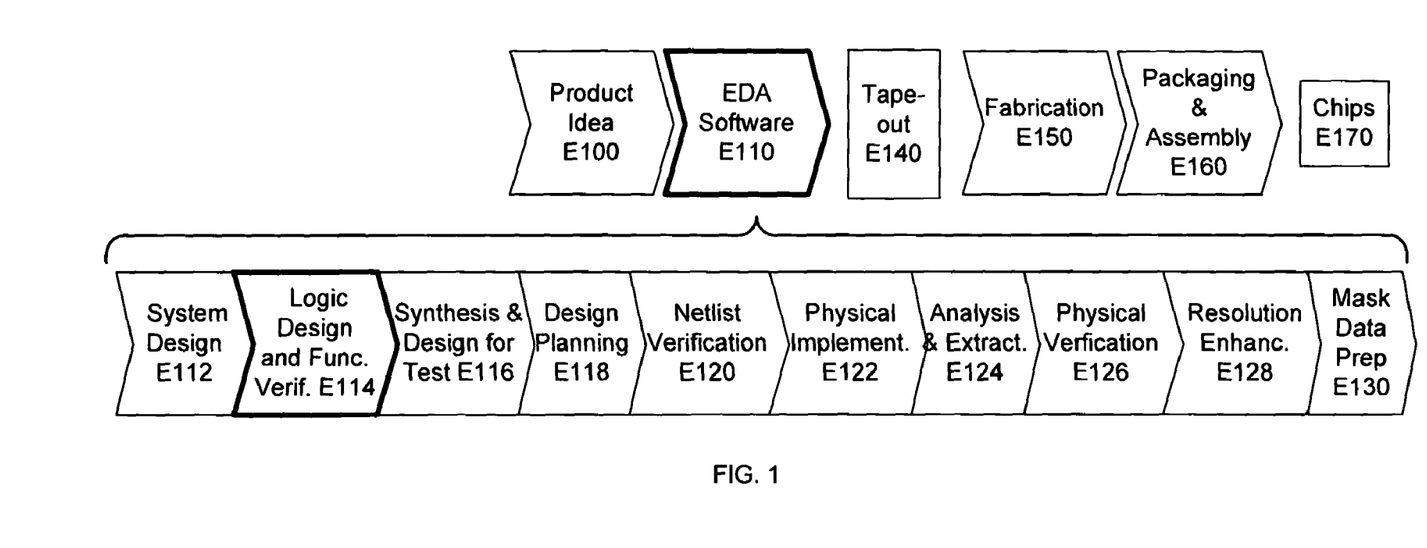
FIG. 1 is a simplified flow diagram of a standard EDA process flow.

FIG. 1 shows a simplified representation of an exemplary digital ASIC design flow. At a high level, the process starts with the product idea (step E100) and is realized in an EDA software design process (step E110). When the design is finalized, it can be taped-out (event E140). After tape out, the fabrication process (step E150) and packaging and assembly processes (step E160) occur resulting, ultimately, in finished chips (result E170).

The EDA software design process (step E110) is actually composed of a number of steps E112-E130, shown in linear fashion for simplicity. In an actual ASIC design process, the particular design might have to go back through steps until certain tests are passed. Similarly, in any actual design process, these steps may occur in different orders and combinations. This description is therefore provided by way of context and general explanation rather than as a specific, or recommended, design flow for a particular ASIC.

A brief description of the component steps of the EDA software design process (step E110) will now be provided. During system design (step E112), the designers describe the functionality that they want to implement and can perform what-if planning to refine functionality, check costs, etc. Hardware-software architecture partitioning can occur at this stage. Exemplary EDA software products from Synopsys, Inc. that can be used at this step include Model Architect, Saber, System Studio, and DesignWare® products.

During logic design and functional verification (step E114), the VHDL or Verilog code for modules in the system is written and the design is checked for functional accuracy. More specifically, does the design as checked to ensure that produces the correct outputs. Exemplary EDA software products from Synopsys, Inc. that can be used at this step include VCS, VERA, DesignWare®, Magellan, Formality, ESP and LEDA products.

During synthesis and design for test (step E116), the VHDL/Verilog is translated to a netlist. The netlist can be optimized for the target technology. Additionally, the design and implementation of tests to permit checking of the finished chip occurs. Exemplary EDA software products from Synopsys, Inc. that can be used at this step include Design Compiler®, Physical Compiler, Test Compiler, Power Compiler, FPGA Compiler, Tetramax, and DesignWare® products.

During design planning (step E118), an overall floorplan for the chip is constructed and analyzed for timing and top-level routing. Exemplary EDA software products from Synopsys, Inc. that can be used at this step include Jupiter and Floorplan Compiler products.

During netlist verification (step E120), the netlist is checked for compliance with timing constraints and for correspondence with the VHDL/Verilog source code. Exemplary EDA software products from Synopsys, Inc. that can be used at this step include VCS, VERA, Formality and PrimeTime products.

During physical implementation (step E122), placement (positioning of circuit elements) and routing (connection of the same) is performed. Exemplary EDA software products from Synopsys, Inc. that can be used at this step include the Astro product.

During analysis and extraction (step E124), the circuit function is verified at a transistor level, this in turn permits what-if refinement. Exemplary EDA software products from Synopsys, Inc. that can be used at this step include Star RC/XT, Raphael, and Aurora products.

During physical verification (step E126), various checking functions are performed to ensure correctness for manufacturing, electrical issues, lithographic issues, and circuitry. Exemplary EDA software products from Synopsys, Inc. that can be used at this step include the Hercules product.

During resolution enhancement (step E128), geometric manipulations of the layout are performed to improve manufacturability of the design. Exemplary EDA software products from Synopsys, Inc. that can be used at this step include the iN-Phase, Proteus, and AFGen products.

Finally, during mask data preparation (step E130), the "tape-out" data for production of masks for lithographic use to produce finished chips is performed. Exemplary EDA software products from Synopsys, Inc. that can be used at this step include the CATS(R) family of products.

Figure 2:
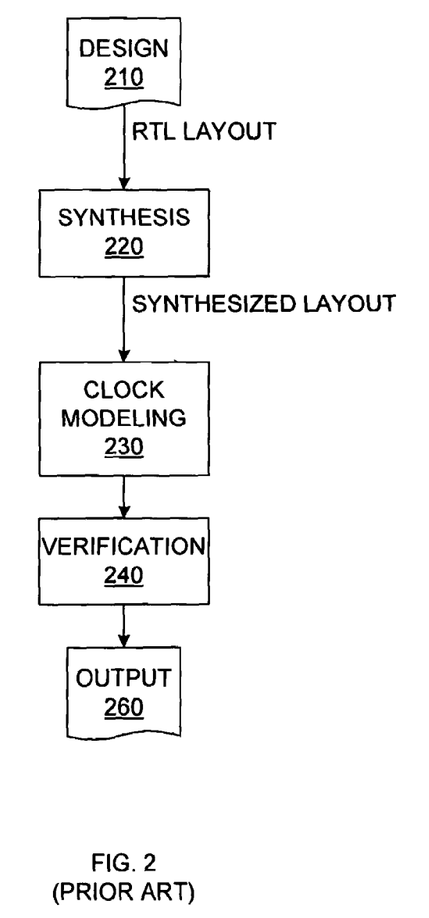
FIG. 2 is a flow diagram of a conventional formal verification process.

As ASIC designs become increasingly complex, formal verification of those designs (step E114) becomes more and more difficult. FIG. 2 shows a flow diagram of a conventional formal verification process. An initial circuit design is first provided in a "DESIGN" step 210. A synthesis operation is then performed on the design in a "SYNTHESIS" step 220, to transform the original gate-level RTL layout into an equivalent set of sequential elements (flip flops and latches) in a synthesized layout. Next, in a "CLOCK MODELING" step 230, the propagation of data through the synthesized layout is monitored in response to discrete clock cycles to test the functionality of the circuit design. During a "VERIFICATION" step 240, the results of the clock modeling are evaluated, and any problems (or lack thereof) are provided in an "OUTPUT" step 260.

Conventional clock modeling methodologies often generate combinational loops when processing a synthesized layout of sequential logic (that includes latches). A combinational loop is problematic because the state of data values at locations within the loop (e.g., inputs to logic gates) are not explicitly defined at a given point in time. In a synthesized layout of sequential logic, any latch implemented in that layout has the potential to generate a combinational loop, due to the nature of latch behavior. Specifically, a latch is transparent when enabled (i.e., data at the latch input is passed directly to the latch output), and therefore cannot provide any stabilizing effect when incorporated into a loop of logic.

Figure 3A:
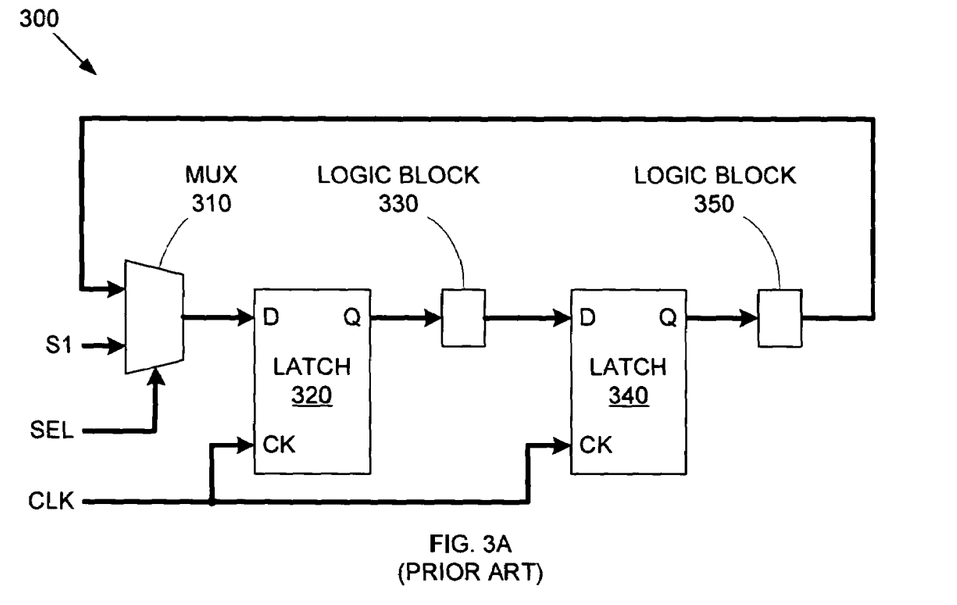
FIGS. 3A and 3B are circuit diagram depictions of a conventional clock modeling technique for latches.

For example, FIG. 3A shows an exemplary portion of a synthesized layout that includes a multiplexer 310, a latch 320, a combinational logic block 330, a latch 340, and a combinational logic block 350, all connected in series, with the output of logic block 350 feeding back into an input of multiplexer 310. A common clock signal CLK is provided to the clock pins CK of latches 320 and 340, while a selection signal SEL provided to multiplexer 310 determines whether an input signal S1 or the output of logic block 350 is provided to the input pin D of latch 320.

If selection signal SEL instructs multiplexer 310 to feed the output of logic block 350 back to latch 320, a combinational loop is realized when clock signal CLK enables both latches 320 and 340 (e.g., when clock signal CLK is in a logic HIGH state). Such a situation is problematic for clock testing because the data values (e.g., the values at inputs D and outputs Q of latches 320 and 340) at the end of a given clock cycle are not explicitly defined by the circuit itself.

For example, if logic block 330 or 350 performs a data inversion, a logic HIGH value at the input of latch 320 will be (relatively) immediately provided as a logic LOW output to multiplexer 310 by logic block 350. Latch 320 will then receive a logic LOW input from multiplexer 310, which will switch the output of logic block 350 to a logic HIGH state. This data oscillation will continue as long as latches 320 and 340 are enabled (i.e., as long as clock signal CLK is in a logic HIGH phase). When clock signal CLK switches to a logic LOW phase, the most recent state of the data in circuit 300 is stored. However, because of the aforementioned combinational loop behavior (data oscillation), specific values for the stored data cannot be determined in a clock modeling environment.

Figure 3B:
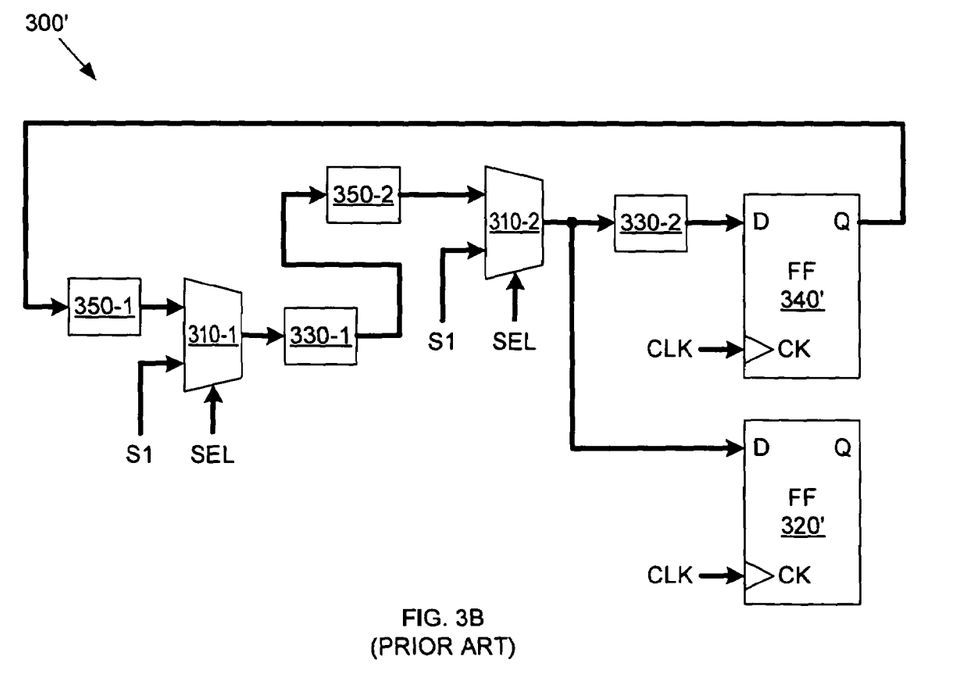

To overcome this problem, conventional formal verification systems typically perform latch "unrolling" to generate a circuit that can be solved using clock modeling. To "unroll" a latch, the logic driven by that latch is duplicated a predetermined number of times to simulate the repetitive looping effect of the combinational loop. For example, FIG. 3B shows a sample unrolled circuit 300' for clock modeling that could be generated from circuit 300 in FIG. 3A. Circuit 300' simulates the combinational loop behavior of circuit 300 by imposing a breakpoint between latch 340 and logic block 350 and replicating the logic following that breakpoint (logic block 350, multiplexer 310, and logic block 330) a certain number of times. Specifically, in circuit 300', logic block 350, multiplexer 310, and logic block 330 are repeated twice the first time as logic block 350-1, multiplexer 310-1, and logic block 330-1, respectively, and the second time as logic block 350-2, multiplexer 310-2, and logic block 330-2, respectively. Circuit 300' therefore simulates two cycles of the combinational loop of circuit 300. Latch 340 (in circuit 300) is replaced with a flip flop 340' coupled between logic block 330-2 and logic block 350-1, while latch 320 (in circuit 300) is replaced with a flip flop 320' coupled to the output of multiplexer 310-2 to complete unrolled circuit 300'. Note that by choosing a breakpoint between latch 340 and logic block 350 in circuit 300, latch 320 is rendered a pass-through element for combinational loop situations. Accordingly, flip flop 320' in circuit 300' simply receives the output of multiplexer 310-2.

Unfortunately, the logic duplicating technique described with respect to FIG. 3B is less than ideal for accurate and efficient clock modeling. The duplicate logic blocks used in place of each latch can significantly expand the size of the synthesized layout, thereby making clock modeling very computationally expensive. Furthermore, since the actual combinational loop behavior of a given circuit will typically depend on propagation delays specific to that circuit, applying the same duplication factor to all latches in a circuit will not accurately represent the behavior of many of those circuits.

Accordingly, it is desirable to provide a method and system for performing formal verification of IC layouts that can accurately account for latch behavior while minimizing computational requirements.

SUMMARY OF THE INVENTION

Latch elements in synthesized layouts are typically not handled effectively by conventional formal verification tools. The standard technique of duplicating logic driven by the output of a latch can result in excessive layout size and inaccurate clock modeling results. By selectively remodeling latch elements in a synthesized layout into flip flops prior to clock modeling, layout expansion can be minimized while modeling accuracy can be improved.

In one embodiment, a method for performing formal verification of an integrated circuit (IC) design can include identifying a set of remodeling-eligible latches in a synthesized layout of sequential logic for the IC design, wherein each of the set of remodeling-eligible latches exhibits flip flop-like output behavior. Next, each of the set of remodeling-eligible latches in the synthesized layout can be replaced with a flip flop to form a remodeled layout. Clock modeling can then be performed on the remodeled layout.

In one embodiment, identifying the set of remodeling-eligible latches can involve applying cone partitioning to the synthesized layout to determine a data fan-in cone and a first clock net for a test latch in the synthesized layout. The test latch can then be included in the set of remodeling-eligible latches if the data fan-in cone does not:

a) include a primary input to the synthesized layout,
b) include a first sequential logic gate driven by a second clock net that is not equivalent to the first clock net, and
c) include a second sequential logic gate that exhibits a first phase behavior that is equivalent to a second phase behavior of the test latch.

Identifying the set of remodeling-eligible latches can further include repeating the steps of applying cone partitioning and including the test latch in the set of remodeling-eligible latches for all latches in the synthesized layout.

In another embodiment, identifying the set of remodeling-eligible latches can involve applying cone partitioning to the synthesized layout to determine a data fan-in cone and a first clock net for a test latch in the synthesized layout. The test latch can then be included in the set of remodeling-eligible latches if:

a) the data fan-in cone does not include a primary input to the synthesized layout,
b) the data fan-in cone does not include a first sequential logic gate driven by a second clock net that is not identical to the first clock net, and c) the data fan-in cone does not include a second sequential logic gate that exhibits a first phase behavior that is equivalent to a second phase behavior of the test latch.

In another embodiment, identifying the set of remodeling-eligible latches can involve applying cone partitioning to the synthesized layout to determine a data fan-in cone and a clock net for each latch in the synthesized layout. A first set of latches can then be excluded from the set of remodeling-eligible latches, wherein the data fan-in cone of each of the first set of latches includes a primary input to the synthesized layout. A second set of latches can also be excluded from the set of remodeling-eligible latches, wherein the data fan-in cone of each of the second set of latches includes at least one sequential logic gate driven by a clock net that is not equivalent to the clock net of the latch. Finally, a third set of latches can be excluded from the set of remodeling-eligible latches, wherein the data fan-in cone for each of the third set of latches includes a first sequential logic gate having a phase behavior that is equivalent to the phase behavior of the latch. The second and third sets of latches can optionally be reported as potential design problems.

In another embodiment, a system for performing formal verification of an integrated circuit (IC) design can include latch selection logic, latch replacement logic, and clock modeling logic. The latch replacement logic provides capability for identifying a first set of latches in a synthesized layout of the IC design that exhibit flip flop-like output behavior. The latch replacement logic provides capability for replacing each of the first set of latches in the synthesized layout with a flip flop to generate a remodeled layout. Finally, the clock modeling logic provides capability for performing clock modeling on the remodeled layout. In one embodiment, the latch selection logic can include logic for applying cone partitioning to the synthesized layout to determine a data fan-in cone and a first clock net for a test latch in the synthesized layout, and logic for including the test latch in the set of remodeling-eligible latches if:

a) the data fan-in cone does not include a primary input to the synthesized layout,
   b) the data fan-in cone does not include a sequential logic gate driven by a clock net that is not equivalent to the first clock net, and
   c) the data fan-in cone does not include a sequential logic gate that exhibits phase behavior equivalent to the phase behavior of the test latch.

In another embodiment, the latch selection logic can include logic for applying cone partitioning to the synthesized layout to determine a data fan-in cone and a first clock net for a test latch in the synthesized layout, and logic for including the test latch in the set of remodeling-eligible latches if:

a) the data fan-in cone does not include a primary input to the synthesized layout,
   b) the data fan-in cone does not include a sequential logic gate driven by a clock net that is not identical to the first clock net, and
   c) the data fan-in cone does not include a sequential logic gate that exhibits phase behavior equivalent to the phase behavior of the test latch.

In another embodiment, the latch selection logic can include:

a) logic for applying cone partitioning to the synthesized layout to determine a data fan-in cone and a clock net for each latch in the synthesized layout,
   b) logic for excluding a first set of latches from the set of remodeling-eligible latches, wherein the data fan-in cone of each of the first set of latches includes a primary input to the synthesized layout,
   c) logic for excluding a second set of latches from the set of remodeling-eligible latches, wherein the data fan-in cone of each of the second set of latches includes at least one sequential logic gate driven by a clock net that is not equivalent to the clock net driving the latch, and
   d) logic for excluding a third set of latches from the set of remodeling-eligible latches, wherein the data fan-in cone for each of the third set of latches includes a sequential logic gate that exhibits a phase behavior that is equivalent the second phase behavior of the latch.

In one embodiment, the system can further include logic for reporting the second set of latches and the third set of latches as potential design problems.

In another embodiment, a computer-readable medium can be encoded with a program for controlling the operation of a computer, with the program including:

a) a first set of instructions for causing the computer to identify a set of latches in a synthesized layout of sequential logic that exhibit flip flop-like output behavior,
   b) a second set of instructions for causing the computer to replace the set of latches with flip flops to generate a remodeled layout, and
   c) a third set of instructions for causing the computer to perform clock modeling on the remodeled layout.

In one embodiment, the first set of instructions can include a first instruction for causing the computer to apply cone partitioning to the synthesized layout to determine a data fan-in cone and a first clock net for a test latch in the synthesized layout, and a second instruction for causing the computer to include the test latch in the set of remodeling-eligible latches if:

a) the data fan-in cone does not include a primary input to the synthesized layout,
   b) the data fan-in cone does not include a sequential logic gate driven by a clock net that is not equivalent to the first clock net, and
   c) the data fan-in cone does not include a sequential logic gate that exhibits phase behavior that is equivalent to the phase behavior of the test latch.

In one embodiment, the first set of instructions can further include a third instruction for causing the computer to repeat the first instruction and the second instruction for all latches in the synthesized layout.

In another embodiment, the first set of instructions can include a first instruction for causing the computer to apply cone partitioning to the synthesized layout to determine a data fan-in cone and a first clock net for a test latch in the synthesized layout, and a second instruction for causing the computer to include the test latch in the set of remodeling-eligible latches if:

a) the data fan-in cone does not include a primary input to the synthesized layout,
   b) the data fan-in cone does not include a sequential logic gate driven by a clock net that is not identical to the first clock net, and
   c) the data fan-in cone does not include a sequential logic gate that exhibits phase behavior that is equivalent to the phase behavior of the test latch.

In another embodiment, the first set of instructions can include:

a) a first instruction for causing the computer to apply cone partitioning to the synthesized layout to determine a data fan-in cone and a clock net for each latch in the synthesized layout, b) a second instruction for causing the computer to exclude a first set of latches from the set of remodeling-eligible latches, wherein the data fan-in cone of each of the first set of latches includes a primary input to the synthesized layout, c) a third instruction for causing the computer to exclude a second set of latches from the set of remodeling-eligible latches, wherein the data fan-in cone of each of the second set of latches includes at least one sequential logic gate driven by a clock net that is not equivalent to the clock net driving the latch, and d) a fourth instruction for causing the computer to exclude a third set of latches from the set of remodeling-eligible latches, wherein the data fan-in cone for each of the third set of latches includes a sequential logic gate having a phase behavior that is equivalent to the phase behavior of the latch.

In one embodiment, the first set of instructions can further include a fifth instruction for reporting the second set of latches and the third set of latches as potential design problems.

The invention will be more fully understood in view of the following description and drawings.

DETAILED DESCRIPTION

Latch elements in synthesized layouts are typically not handled effectively by conventional formal verification tools. The standard technique of duplicating logic driven by the output of a latch can result in excessive layout size and inaccurate clock modeling results. By selectively remodeling latch elements in a synthesized layout into flip flops prior to clock modeling, layout expansion can be minimized while modeling accuracy can be improved.

In one embodiment, the remodeling of latches in a synthesized layout of sequential logic makes use of "cone partitioning". Cone partitioning is a well-known technique in which the logic feeding into a pin of a latch is defined as the "fan-in cone" for that pin. The process starts at the latch pin, and expands out recursively to compile upstream logic until a primary input (i.e., an external input to the circuit) or a sequential logic gate (latch or flip flop) is reached (the sequential logic gate is included in the fan-in cone).

Figure 4:
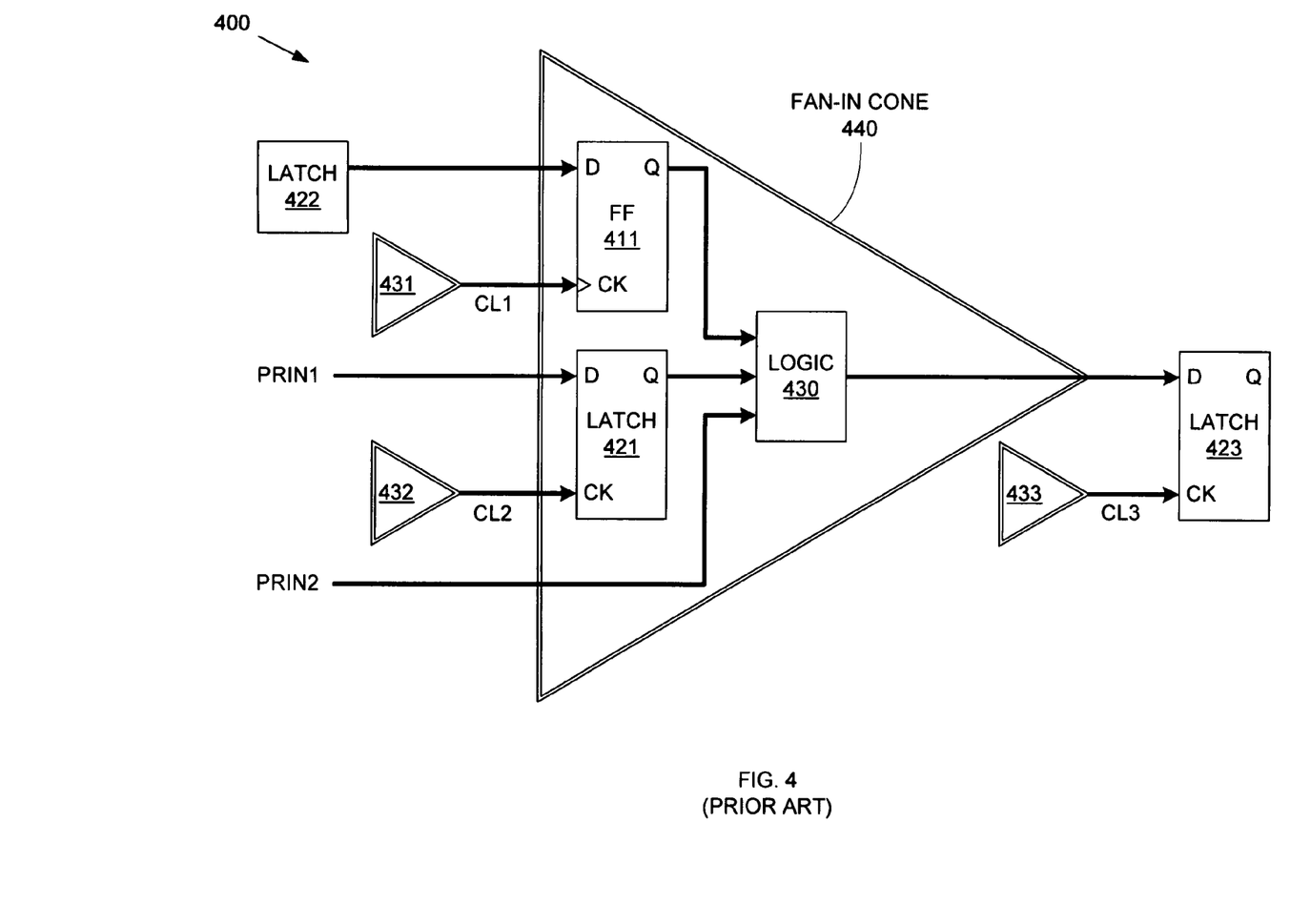
FIG. 4 is a circuit diagram of an exemplary fan-in cone for a latch.

For example, FIG. 4 shows an exemplary sequential logic circuit 400 that includes latches 421, 422, and 423, a flip flop 411, combinational logic 430, and clock generation logic sets 431, 432, and 433. The output of latch 422 feeds an input pin D of flip flop 411, while a primary input signal PRIN1 feeds an input pin D of latch 421. Output pins Q of flip flop 411 and latch 421 then feed into combinational logic 430. A second primary input signal PRIN2 feeds directly into combinational logic 430. The output of combinational logic 430 then feeds into an input pin D of latch 423.

A fan-in cone 440 for latch 423 can therefore be defined to include flip flop 411, latch 421, and combinational logic 430. Note that latch 422, which feeds into flip flop 411, is not included in fan-in cone 440 since flip flop 411 sets the boundary of fan-in cone 440 (i.e., flip flop 411 is the first sequential logic gate upstream of input pin D of latch 423). Note further that while fan-in cone 440 is depicted as including a single flip flop 411 and a single latch 421 for exemplary purposes, a fan-in cone may include any number of latches and/or flip flops. For example, the fan-in cone for flip flop 411 includes only latch 422, while the fan-in cone for latch 421 does not include any sequential logic gates, as the input pin D of latch 421 is fed directly from primary input signal PRIN1.

Note further that the clock signals CL1, CL2, and CL3 for clock pins CK of flip flop 411, latch 421, and latch 423, respectively, are themselves provided by fan-in cones 431, 432, and 433, respectively (defined in the same manner described above with respect to fan-in cone 440). The fan-in cone to a clock pin is sometimes referred to as a "clock net", and represents the logic that determines the actual clock signal provided to that clock pin. If the fan-in cones for different clock pins (on different sequential logic gates) provide the same functionality, then the clock nets for the logic gates are said to be equivalent clock nets.

For example, in a synchronous logic design, each of logic cones 431, 432, and 433 could provide a master clock signal directly to clock pins CK of flip flop 411, latch 421, and latch 423, respectively (i.e., clock signals CL1, CL2, and CL3 are all equal to the master clock signal). In such a case, the clock nets for flip flop 411 and latches 421 and 423 would all be equivalent (even if the specific logic within fan-in cones 431, 432, and 433 are not identical). However, if fan-in cones 431, 432, and 433 provide differing functionality (e.g., fan-in cone 431 provides the master clock signal as clock signal CL1 while fan-in cone 432 generates clock signal CL2 to be asynchronous from clock signal CL1), then the clock nets are not considered to be equivalent.

Figure 5:
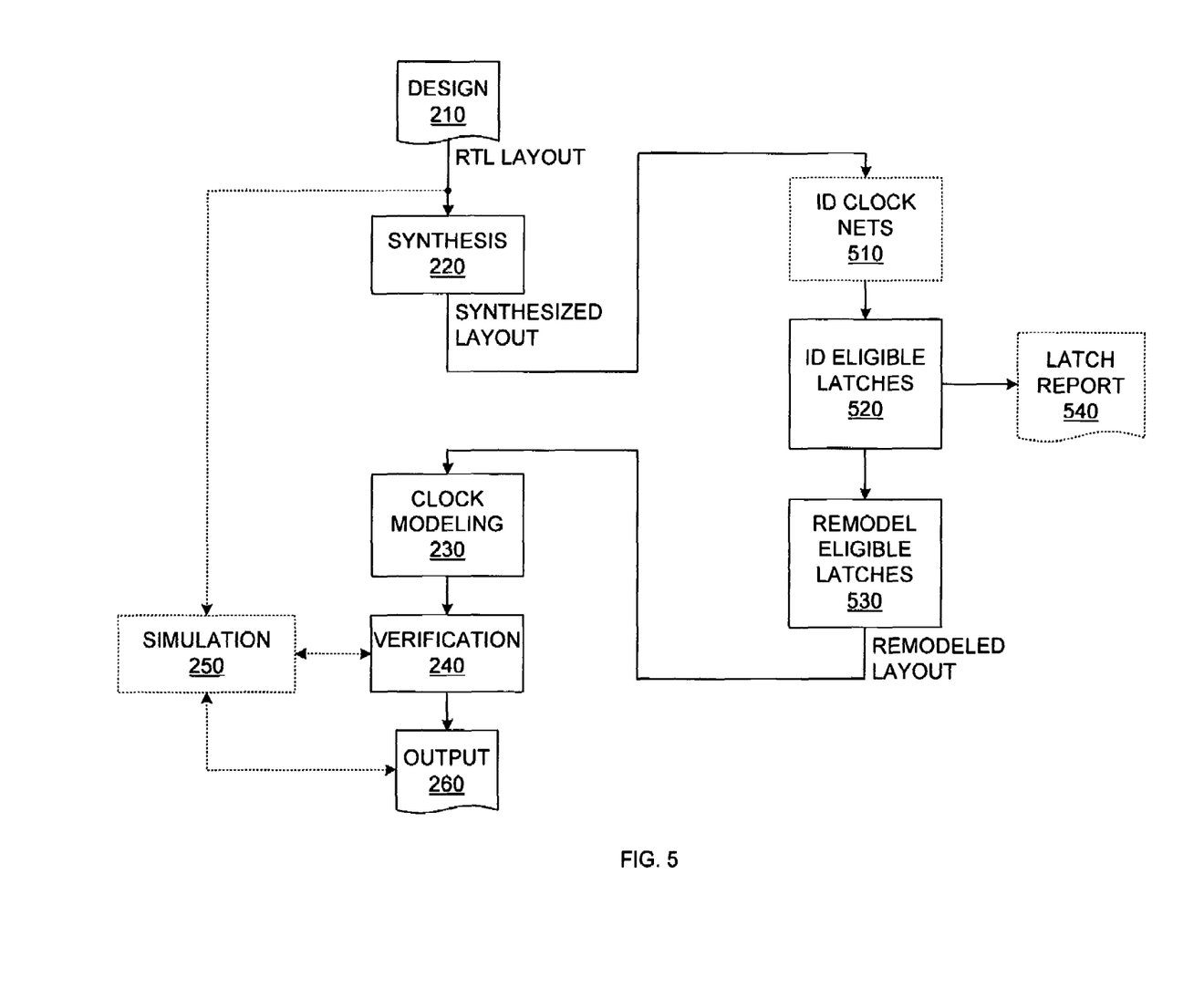
FIG. 5 is a flow diagram of a formal verification process that incorporates selective latch remodeling prior to clock modeling.

By applying cone partitioning to a synthesized layout of sequential logic and evaluating the fan-in cones for the latches in the synthesized layout, latches that exhibit flip flop-like output behavior (i.e., the output of each such latch is the same as the output that would be provided if the latch were replaced with a flip flop) can be identified. By replacing those flip flop-like latches with actual flip flops, the synthesized layout can be optimized for subsequent clock modeling. For example, FIG. 5 shows an embodiment of a flow diagram of a formal verification methodology that incorporates this type of layout optimization. Steps 210 ("DESIGN"), 220 ("SYNTHESIS"), 230 ("CLOCK MODELING"), 240 ("VERIFICATION"), and 260 ("OUTPUT") are substantially similar to those described with respect to the similarly-labeled steps of FIG. 2.

However, rather than providing the synthesized layout from step 220 directly to step 230, the synthesized layout is modified into a remodeled layout in which latches are remodeled into flip flops where such remodeling does not affect circuit function. First, an optional "ID CLOCK NETS" step 510, the clock nets for the various sequential logic gates in the synthesized layout are identified (as described above with respect to FIG. 4). Then, in an "ID ELIGIBLE LATCHES" step 520, remodeling-eligible latches are identified based on the clock and fan-in cone characteristics of those latches (described in greater detail below). The identified latches are then replaced with flip flops in a "REMODEL ELIGIBLE LATCHES" step 530, thereby generating the remodeled layout that can be used for clock modeling in step 230.

Because a flip flop is an edge-triggered sequential logic gate, a flip flop does not present the problematic transparency exhibited by an enabled latch during clock modeling. Therefore, by replacing latches with flip flops where possible, the amount of logic duplication (i.e., the duplication of logic to simulate latch behavior as described with respect to FIGS. 3A and 3B) required during clock modeling can be minimized. Furthermore, by identifying and replacing latches that exhibit flip flop-like behavior, clock modeling accuracy is improved. Specifically, since the behavior of those replaced latches can be modeled precisely (the replacement flip flops provide well-defined logic states at each clock transition), clock modeling of the remodeled portions of the layout no longer depends on the approximations provided by conventional logic duplication methods (described with respect to FIGS. 3A and 3B).

Note that the remodeling of steps 510, 520, and 530 can be easily incorporated into existing formal verification engines, as no changes are required in the subsequent clock modeling and verification steps (i.e., steps 230-260). The synthesized layout that would normally be used for clock modeling is simply replaced with the remodeled layout generated through selective latch replacement. The remodeling of steps 510, 520, and 530 can therefore be readily integrated into even advanced formal verification tools.

For example, the Magellan tool from Synopsys, Inc. can perform an optional "SIMULATION" step 250 in addition to the depicted functional verification operation, in which direct simulation of an RTL layout is performed. The results of such simulation can then be evaluated in conjunction with the formal verification data (as indicated by the arrows between steps 250 and 240, and between steps 250 and 260) to further enhance the verification process. As shown in FIG. 5, the remodeling provided by steps 510, 520, and 530 still fits seamlessly into this, and any other, formal verification process.

To identify the remodeling-eligible latches in the synthesized layout, a set of selection rules can be applied in step 510. In one embodiment, the set of rules can include the following:

1. If the data fan-in cone for a latch includes one or more primary inputs, then the latch is not eligible for remodeling.
2. If the data fan-in cone for a latch includes sequential logic gates that are driven by clock nets that are not equivalent to the clock net of the latch, then the latch is not eligible for remodeling.
3. If the phase behavior of the latch is equivalent to any of the sequential logic gates in the data fan-in cone, then the latch is not eligible for remodeling.

Any latch that is not rendered remodeling-ineligible any of the above three rules can then be considered to be remodeling-eligible (i.e., a latch exhibiting flip flop-like output behavior). Therefore, by applying the above three rules (described in greater detail below) to the latches in a synthesized layout, those latches not eligible for remodeling can be weeded out, and the remaining latches can be replaced with flip flops without adversely affecting the performance accuracy of the layout.

A primary input is an input that is provided from outside the circuit being modeled. Therefore, a fan-in cone for a latch that includes a primary input will not necessarily provide well-defined logic states at clock transitions for the latch. Such a fan-in cone can provide data to a latch that is asynchronous with the clock signal provided to that latch, thereby precluding replacement of that (level-sensitive) latch with an (edge-sensitive) flip flop. Accordingly, a latch having a fan-in cone that includes a primary input cannot be remodeled into a flip flop (rule 1).

Similarly, if any sequential logic gates in the fan-in cone of a latch are driven by clock nets that are not equivalent to the clock net of the latch, then data provided to the latch from the fan-in cone may be asynchronous with the clock signal of the latch. Once again, this asynchronous behavior precludes replacement of the latch with a flip flop. Accordingly, a latch having a fan-in cone that includes one or more non-equivalent clock nets cannot be remodeled into a flip flop (rule 2).

Note that if clock net identification has not been performed on the synthesized layout (i.e., step 510 in FIG. 5 is skipped), then rule 2 can still be applied, except that the clock fan-in cones for the sequential elements in the data fan-in cone of the latch must be identical to the clock fan-in cone for the latch (i.e., identical logic, rather than just identical functionality). Therefore, under such circumstances, a latch would not be remodeling-eligible if the clock nets in its data fan-in cone are not identical to its own clock net.

Finally, even if the fan-in cone of a latch exhibits clock net equivalence with the clock net of the latch, timing issues can make latch remodeling unacceptable. Specifically, because an enabled latch is transparent, data provided at the input of the enabled latch is (essentially) immediately provided at the output of the latch. However, a flip flop latches input data at a first clock edge (e.g., rising edge) and latches output data at a second clock edge (e.g., falling edge), so that data is provided at the output of the flip flop one clock cycle after that data is provided at the input of the flip flop. Therefore, if a latch is fed by other sequential logic devices that have equivalent phase behavior (e.g., all latches enabled by a logic HIGH clock signal and all flip flops latching input data at a logic HIGH clock transition), replacing that latch with a flip flop will introduce an extra delay (one clock cycle) in the output data stream. Accordingly, a latch with a fan-in cone that includes one or more sequential logic gates having equivalent phase behavior to the latch cannot be remodeled into a flip flop (rule 3).

However, if a latch has a fan-in cone that includes only clock nets that are equivalent to the clock net of the latch, and the sequential logic gates in the fan-in cone have the opposite phase behavior as the latch (e.g., latch is enabled by a logic HIGH clock signal and all sequential logic gates in the fan-in cone are enabled by a logic LOW clock signal or a logic LOW clock transition), then the latch will always be enabled one clock cycle after a data value is presented at the input of the latch. Therefore, such a latch can be replaced by a flip flop without affecting the output timing originally provided by the latch.

Note that latches deemed not to be remodeling-eligible by rules 2 and 3 above may indicate design problems that should be flagged. For example, rule 2 can indicate potentially asynchronous behavior in the circuit, while rule 3 can reveal potential indeterminate data paths (e.g., a string of latches that may all be transparent simultaneously). Therefore, in one embodiment, the remodeling process can include an optional "LATCH REPORT" step 540, in which these problematic latches are identified for further review.

Note further that while the set of rules used to identify the remodeling-eligible latches in a synthesized layout are described as a set of three exclusionary rules for exemplary purposes, any rule set providing similar selection capability can be used. For example, in another embodiment, the rule set could include a single rule A as follows:

A. If the data fan-in cone for a latch does not include any primary inputs, includes only clock nets that are equivalent to the clock net for the latch, and includes only sequential logic gates that exhibit phase behavior that is opposite to the phase behavior of the latch, then the latch can be remodeled.

Figure 6:
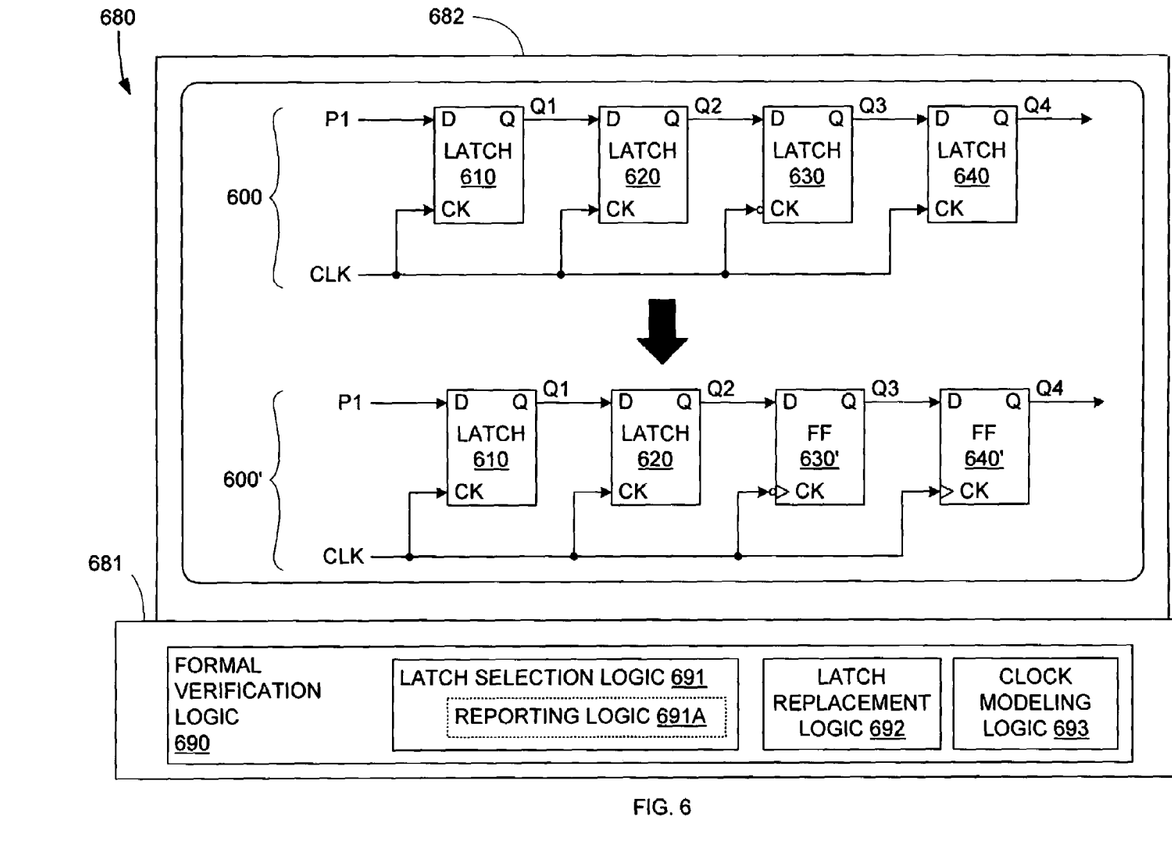
FIG. 6 is a schematic diagram of a system for performing formal verification based on selective latch remodeling.

FIG. 6 shows an embodiment of a computer system 680 for performing formal verification as described with respect to the flow diagram in FIG. 5. Computer system 680 includes a processing system 681 (e.g., a personal computer or client workstation) and a graphical display 682 (e.g., a monitor). Processing system 681 can comprise formal verification logic 690 that includes latch selection logic 591, latch replacement logic 692, and clock modeling logic 693. Note that formal verification logic 690 can comprise a software program (computer instructions) encoded on a computer-readable medium (e.g., hard drive, CD-ROM, or DVD-ROM) in processing system 681 or external to processing system 681 (e.g., processing system 681 can be a "thin client" that runs the software from a network-attached server).

Latch selection logic 691 identifies remodeling-eligible latches in a synthesized layout, as described with respect to steps 510 and 520 in FIG. 5. Latch replacement logic 692 replaces the remodeling-eligible latches identified by latch selection logic 691 with flip flops to generate a remodeled layout, as described with respect to step 530 in FIG. 5. Clock modeling logic 693 can then perform clock modeling on the remodeled layout, as described with respect to step 230 in FIG. 5. Note that while only latch selection logic 591, latch replacement logic 692, and clock modeling logic 693 are depicted for clarity, formal verification logic 690 can include any additional logic required for performing steps 210, 220, 240, 250, and/or 260 shown in FIG. 5. In one embodiment, such additional logic can comprise any existing code for performing formal verification.

An example of the remodeling performed by latch selection logic 691 and latch replacement logic 692 is depicted on graphical display 682. An initial synthesized layout 600 includes latches 610, 620, 630, and 640 connected in series and driven by the same clock signal CLK. Latches 610, 620, and 640 are logic HIGH-enabled gates, while latch 630 is a logic LOW-enabled gate (i.e., latch 630 has the opposite phase behavior from that of latches 610, 620, and 640). Latch selection logic 691 in processing system 681 can then identify the latches exhibiting flip flop-like output behavior in layout 600.

In one embodiment, latch selection logic 691 can apply rules 1 through 3 described above. Based on rule 1, latch 610 is not eligible for remodeling because the fan-in cone to latch 610 includes a primary input P1. None of the remaining latches are eliminated by rule 2, since each of latches 620, 630, and 640 (and latch 610) is clocked by the same clock signal CLK. Therefore, the clock nets for all the latches are equivalent (in fact, the clock nets are identical). Finally, applying rule 3, latch 620 is identified as not being eligible for remodeling, as the fan-in cone for latch 620 includes latch 610, which has the same phase behavior as latch 620. Meanwhile, latch 630 is not eliminated by rule 3, since the fan-in cone for latch 630 includes only latch 620, which has the opposite phase behavior from latch 630. Similarly, latch 640 is not eliminated by rule 3, since the fan-in cone for latch 640 includes only latch 630, which has the opposite phase behavior from latch 640. In this manner, latch selection logic 691 can identify latches 630 and 640 as being remodeling-eligible. Note that in one embodiment, latch selection logic 691 can include optional reporting logic 691A for identifying latches that fail rules 2 or 3, as described with respect to step 540 in FIG. 5.

Latch replacement logic 692 can then replace latches 630 and 640 with flip flops 630' and 640', respectively, to generate remodeled layout 600'. Clock modeling logic 693 can then perform clock modeling on remodeled layout 600' as part of the formal verification process. Because remodeled layout 600' includes fewer latches than the original synthesized layout, the computational requirements for processing system 681 can be reduced over systems performing clock modeling directly on (non-remodeled) synthesized layouts. Note that while the transformation of synthesized layout 600 into remodeled layout 600' is depicted on graphical display 682 for exemplary purposes, in various other embodiments, the transformation can be performed without any visual depiction or with a different visual depiction.

The various embodiments of the structures and methods of this invention that are described above are illustrative only of the principles of this invention and are not intended to limit the scope of the invention to the particular embodiments described. Thus, the invention is limited only by the following claims and their equivalents.

The invention claimed is:

1. A method for performing formal verification of an integrated circuit (IC) design, the method comprising:
   identifying a set of remodeling-eligible latches in a synthesized layout of sequential logic for the IC design, each of the set of remodeling-eligible latches exhibiting flip flop output behavior;
   replacing each of the set of remodeling-eligible latches in the synthesized layout with a flip flop to form a remodeled layout; and
   performing clock modeling on the remodeled layout,
   wherein identifying the set of remodeling-eligible latches comprises:
   applying cone partitioning to the synthesized layout to determine a data fan-in cone and a first clock net for a test latch in the synthesized layout, wherein cone partitioning starts at a latch pin and expands out recursively to compile upstream logic until one of a primary input and a sequential logic gate is reached; and
   including the test latch in the set of remodeling-eligible latches if:
   the data fan-in cone does not include a primary input to the synthesized layout;
   the data fan-in cone does not include a first sequential logic gate driven by a second clock net that is not functionally equivalent to the first clock net; and
   the data fan-in cone does not include a second sequential logic gate that exhibits a first phase behavior that is equivalent to a second phase behavior of the test latch.

2. The method of claim 1, wherein identifying the set of remodeling-eligible latches further comprises repeating the steps of applying cone partitioning and including the test latch in the set of remodeling-eligible latches for all latches in the synthesized layout.

3. A method for performing formal verification of an integrated circuit (IC) design, the method comprising:

identifying a set of remodeling-eligible latches in a synthesized layout of sequential logic for the IC design, each of the set of remodeling-eligible latches exhibiting flip flop output behavior;

replacing each of the set of remodeling-eligible latches in the synthesized layout with a flip flop to form a remodeled layout; and performing clock modeling on the remodeled layout, wherein identifying the set of remodeling-eligible latches comprises:

applying cone partitioning to the synthesized layout to determine a data fan-in cone and a first clock net for a test latch in the synthesized layout, wherein cone partitioning starts at a latch pin and expands out recursively to compile upstream logic until one of a primary input and a sequential logic gate is reached; and including the test latch in the set of remodeling-eligible latches if:

the data fan-in cone does not include a primary input to the synthesized layout;

the data fan-in cone does not include a first sequential logic gate driven by a second clock net that is not identical to the first clock net; and the data fan-in cone does not include a second sequential logic gate that exhibits a first phase behavior that is equivalent to a second phase behavior of the test latch.

4. A method for performing formal verification of an integrated circuit (IC) design, the method comprising:

identifying a set of remodeling-eligible latches in a synthesized layout of sequential logic for the IC design, each of the set of remodeling-eligible latches exhibiting flip flop output behavior;

replacing each of the set of remodeling-eligible latches in the synthesized layout with a flip flop to form a remodeled layout; and performing clock modeling on the remodeled layout, wherein identifying the set of remodeling-eligible latches comprises:

applying cone partitioning to the synthesized layout to determine a data fan-in cone and a clock net for each latch in the synthesized layout, wherein cone partitioning starts at a latch pin and expands out recursively to compile upstream logic until one of a primary input and a sequential logic gate is reached;

excluding a first set of latches from the set of remodeling-eligible latches, wherein the data fan-in cone of each of the first set of latches includes a primary input to the synthesized layout;

excluding a second set of latches from the set of remodeling-eligible latches, wherein the data fan-in cone of each of the second set of latches includes at least one sequential logic gate driven by a first clock net, wherein the first clock net is not equivalent to a second clock net driving the each of the second set of latches; and excluding a third set of latches from the set of remodeling-eligible latches, wherein the data fan-in cone for each of the third set of latches includes a first sequential logic gate having a first phase behavior that is equivalent to a second phase behavior of the each of the third set of latches.

5. The method of claim 4, further comprising reporting the second set of latches and the third set of latches as potential design problems.

6. A system for performing formal verification of an integrated circuit (IC) design, the system comprising:

latch selection logic for identifying a first set of latches in a synthesized layout of the IC design, each of the first set of latches exhibiting flip flop output behavior;

latch replacement logic for replacing each of the first set of latches in the synthesized layout with a flip flop to generate a remodeled layout; and clock modeling logic for performing clock modeling on the remodeled layout, wherein the latch selection logic comprises:

logic for applying cone partitioning to the synthesized layout to determine a data fan-in cone and a first clock net for a test latch in the synthesized layout, wherein cone partitioning starts at a latch pin and expands out recursively to compile upstream logic until one of a primary input and a sequential logic gate is reached; and logic for including the test latch in the set of remodeling-eligible latches if:

the data fan-in cone does not include a primary input to the synthesized layout;

the data fan-in cone does not include a first sequential logic gate driven by a second clock net that is not functionally equivalent to the first clock net; and the data fan-in cone does not include a second sequential logic gate that exhibits a first phase behavior that is equivalent to a second phase behavior of the test latch.

7. A system for performing formal verification of an integrated circuit (IC) design, the system comprising:

latch selection logic for identifying a first set of latches in a synthesized layout of the IC design, each of the first set of latches exhibiting flip flop output behavior;

latch replacement logic for replacing each of the first set of latches in the synthesized layout with a flip flop to generate a remodeled layout; and clock modeling logic for performing clock modeling on the remodeled layout, wherein the latch selection logic comprises:

logic for applying cone partitioning to the synthesized layout to determine a data fan-in cone and a first clock net for a test latch in the synthesized layout, wherein cone partitioning starts at a latch pin and expands out recursively to compile upstream logic until one of a primary input and a sequential logic gate is reached; and logic for including the test latch in the set of remodeling-eligible latches if:

the first data fan-in cone does not include a primary input to the synthesized layout;

the data fan-in cone does not include a first sequential logic gate driven by a second clock net that is not identical to the first clock net; and the data fan-in cone does not include a second sequential logic gate that exhibits a first phase behavior that is equivalent to a second phase behavior of the test latch.

8. A system for performing formal verification of an integrated circuit (IC) design, the system comprising:

latch selection logic for identifying a first set of latches in a synthesized layout of the IC design, each of the first set of latches exhibiting flip flop output behavior;

latch replacement logic for replacing each of the first set of latches in the synthesized layout with a flip flop to generate a remodeled layout; and clock modeling logic for performing clock modeling on the remodeled layout, wherein the latch selection logic comprises:

logic for applying cone partitioning to the synthesized layout to determine a data fan-in cone and a clock net for each latch in the synthesized layout, wherein cone partitioning starts at a latch pin and expands out recursively to compile upstream logic until one of a primary input and a sequential logic gate is reached;

logic for excluding a first set of latches from the set of remodeling-eligible latches, wherein the data fan-in cone of each of the first set of latches includes a primary input to the synthesized layout;

logic for excluding a second set of latches from the set of remodeling-eligible latches, wherein the data fan-in cone of each of the second set of latches includes at least one sequential logic gate driven by a first clock net, wherein the first clock net is not equivalent to a second clock net driving the each of the second set of latches; and logic for excluding a third set of latches from the set of remodeling-eligible latches, wherein the data fan-in cone for each of the third set of latches includes a first sequential logic gate having a first phase behavior that is equivalent to a second phase behavior of the each of the third set of latches.

9. The method of claim 8, wherein the latch selection logic further comprises logic for reporting the second set of latches and the third set of latches as potential design problems.

10. A computer-readable medium encoded with a program for controlling the operation of a computer, the program comprising:

a first set of instructions for causing the computer to identify a set of latches in a synthesized layout of sequential logic that exhibit flip flop output behavior;

a second set of instructions for causing the computer to replace the set of latches with flip flops to generate a remodeled layout; and a third set of instructions for causing the computer to perform clock modeling on the remodeled layout, wherein the first set of instructions comprises:

a first instruction for causing the computer to apply cone partitioning to the synthesized layout to determine a data fan-in cone and a first clock net for a test latch in the synthesized layout, wherein cone partitioning starts at a latch pin and expands out recursively to compile upstream logic until one of a primary input and a sequential logic gate is reached; and a second instruction for causing the computer to include the test latch in the set of remodeling-eligible latches if:

the data fan-in cone does not include a primary input to the synthesized layout;

the data fan-in cone does not include a first sequential logic gate driven by a second clock net that is not functionally equivalent to the first clock net; and the data fan-in cone does not include a second sequential logic gate that exhibits a first phase behavior that is equivalent to a second phase behavior of the test latch.

11. The computer-readable medium of claim 10, wherein the first set of instructions further comprises a third instruction for causing the computer to repeat the first instruction and the second instruction for all latches in the synthesized layout.

12. A computer-readable medium encoded with a program for controlling the operation of a computer, the program comprising:

a first set of instructions for causing the computer to identify a set of latches in a synthesized layout of sequential logic that exhibit flip flop output behavior;

a second set of instructions for causing the computer to replace the set of latches with flip flops to generate a remodeled layout; and a third set of instructions for causing the computer to perform clock modeling on the remodeled layout, wherein the first set of instructions comprises:

a first instruction for causing the computer to apply cone partitioning to the synthesized layout to determine a data fan-in cone and a first clock net for a test latch in the synthesized layout, wherein cone partitioning starts at a latch pin and expands out recursively to compile upstream logic until one of a primary input and a sequential logic gate is reached; and a second instruction for causing the computer to include the test latch in the set of remodeling-eligible latches if:

the data fan-in cone does not include a primary input to the synthesized layout;

the data fan-in cone does not include a first sequential logic gate driven by a second clock net that is not identical to the first clock net; and the data fan-in cone does not include a second sequential logic gate that exhibits a first phase behavior that is equivalent to a second phase behavior of the test latch.

13. A computer-readable medium encoded with a program for controlling the operation of a computer, the program comprising:

a first set of instructions for causing the computer to identify a set of latches in a synthesized layout of sequential logic that exhibit flip flop output behavior;

a second set of instructions for causing the computer to replace the set of latches with flip flops to generate a remodeled layout; and a third set of instructions for causing the computer to perform clock modeling on the remodeled layout, wherein the first set of instructions comprises:

a first instruction for causing the computer to apply cone partitioning to the synthesized layout to determine a data fan-in cone and a clock net for each latch in the synthesized layout, wherein cone partitioning starts at a latch pin and expands out recursively to compile upstream logic until one of a primary input and a sequential logic gate is reached;

a second instruction for causing the computer to exclude a first set of latches from the set of remodeling-eligible latches, wherein the data fan-in cone of each of the first set of latches includes a primary input to the synthesized layout;

a third instruction for causing the computer to exclude a second set of latches from the set of remodeling-eligible latches, wherein the data fan-in cone of each of the second set of latches includes at least one sequential logic gate driven by a first clock net, wherein the first clock net is not equivalent to a second clock net driving the each of the second set of latches; and a fourth instruction for causing the computer to exclude a third set of latches from the set of remodeling-eligible latches, wherein the data fan-in cone for each of the third set of latches includes a first sequential logic gate having a first phase behavior that is equivalent to a second phase behavior of the each of the third set of latches.

14. The computer-readable medium of claim 13, wherein the first set of instructions further comprises a fifth instruction for reporting the second set of latches and the third set of latches as potential design problems.

* * * * *